US010483176B2

(12) United States Patent
Oya

(10) Patent No.: US 10,483,176 B2
(45) Date of Patent: Nov. 19, 2019

(54) SEMICONDUCTOR MODULE

(71) Applicant: Mitsubishi Electric Corporation, Tokyo (JP)

(72) Inventor: Daisuke Oya, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 15/766,112

(22) PCT Filed: Dec. 4, 2015

(86) PCT No.: PCT/JP2015/084164
§ 371 (c)(1),
(2) Date: Apr. 5, 2018

(87) PCT Pub. No.: WO2017/094189
PCT Pub. Date: Jun. 8, 2017

(65) Prior Publication Data
US 2018/0286771 A1 Oct. 4, 2018

(51) Int. Cl.
H01L 23/10 (2006.01)
H01L 25/07 (2006.01)
(Continued)

(52) U.S. Cl.
CPC .............. H01L 23/10 (2013.01); H01L 23/04 (2013.01); H01L 23/053 (2013.01); H01L 23/24 (2013.01);
(Continued)

(58) Field of Classification Search
CPC ................................ H01L 23/10; H01L 25/072
See application file for complete search history.

(56) References Cited

U.S. PATENT DOCUMENTS 4,893,215 A * 1/1990 Urushiwara ......... H05K 5/0052
174/535
5,602,720 A * 2/1997 Natsuhara ........... H01L 23/3735
174/16.3
(Continued)

FOREIGN PATENT DOCUMENTS

JP H07-106458 A 4/1995
JP H11-238821 A 8/1999
(Continued)

OTHER PUBLICATIONS

An Office Action issued by the Japanese Patent Office dated Apr. 17, 2018, which corresponds to Japanese Patent Application No. 2017-553591 and is related to U.S. Appl. No. 15/776,112; with English translation.
(Continued)

Primary Examiner — Peniel M Gumedzoe
(74) Attorney, Agent, or Firm — Studebaker & Brackett PC

(57) ABSTRACT

Provided is a semiconductor module in which a case and a base plate joined together with a simple structure, the semiconductor module having high insulation strength. The semiconductor module includes the following: a base plate; at least one semiconductor chip disposed inside the base plate other than the outer periphery of the base plate and above the base plate; and a case joined to the outer periphery of the base plate with an adhesive, and containing the at least one semiconductor chip. The upper surface of the base plate is provided with a recess or a protrusion between an inner wall of the case and the at least one semiconductor chip in a plan view.

7 Claims, 4 Drawing Sheets

(51) Int. Cl.
*H01L 23/373* (2006.01)
*H01L 23/04* (2006.01)
*H01L 23/053* (2006.01)
*H01L 23/24* (2006.01)
*H01L 25/18* (2006.01)
*H01L 23/367* (2006.01)

(52) U.S. Cl.
CPC ........ *H01L 23/3735* (2013.01); *H01L 25/072* (2013.01); *H01L 23/367* (2013.01); *H01L 25/18* (2013.01); *H01L 2224/32225* (2013.01); *H01L 2924/1033* (2013.01); *H01L 2924/10253* (2013.01); *H01L 2924/10272* (2013.01); *H01L 2924/12032* (2013.01); *H01L 2924/13055* (2013.01); *H01L 2924/13091* (2013.01); *H01L 2924/3511* (2013.01); *H01L 2924/3512* (2013.01)

(56) References Cited

U.S. PATENT DOCUMENTS

| | | | | |
|---|---|---|---|---|
| 5,606,200 | A * | 2/1997 | Haraguchi | H01L 23/04 |
| | | | | 257/687 |
| 7,113,400 | B2 * | 9/2006 | Nagata | B60R 16/0239 |
| | | | | 123/41.31 |
| 7,679,923 | B2 * | 3/2010 | Inagaki | H05K 3/284 |
| | | | | 174/521 |
| 2008/0006932 | A1 | 1/2008 | Koga et al. | |
| 2008/0101032 | A1 * | 5/2008 | Tschirbs | H01L 23/4006 |
| | | | | 361/719 |
| 2013/0277819 | A1 * | 10/2013 | Yoshida | H01L 21/52 |
| | | | | 257/687 |
| 2014/0231982 | A1 * | 8/2014 | Ogawa | H01L 23/053 |
| | | | | 257/712 |

FOREIGN PATENT DOCUMENTS

| | | |
|---|---|---|
| JP | H11-265976 A | 9/1999 |
| JP | 2000-323593 A | 11/2000 |
| JP | 2004-228286 A | 8/2004 |
| JP | 2006-100320 A | 4/2006 |
| JP | 2008-016551 A | 1/2008 |
| JP | 2009-070863 A | 4/2009 |
| JP | 2012-204366 A | 10/2012 |
| JP | 2014-203978 A | 10/2014 |
| JP | 2015-023128 A | 2/2015 |

OTHER PUBLICATIONS

International Search Report issued in PCT/JP2015/084164; dated Feb. 16, 2016.
International Preliminary Report on Patentability issued in corresponding International Application No. PCT/JP2015/084164, dated Jun. 14, 2018; with English translation.

* cited by examiner

F I G. 1
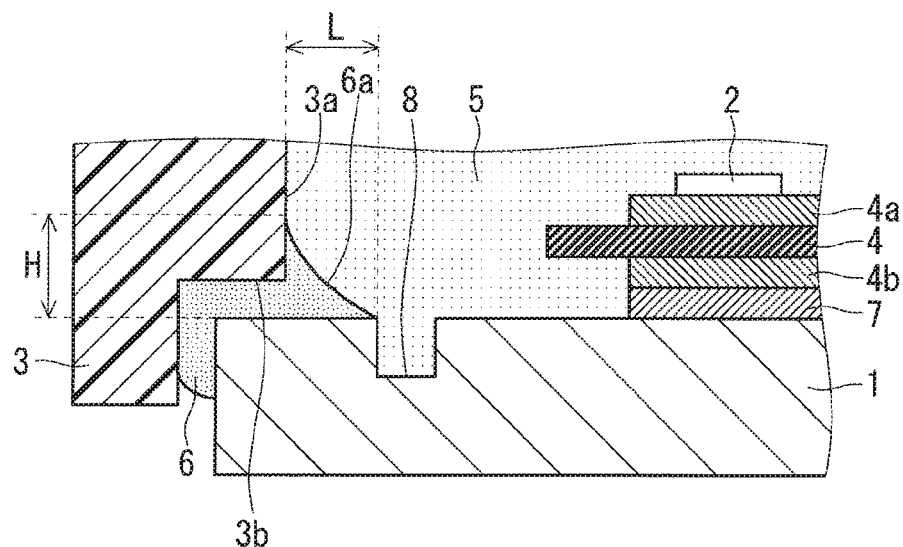
F I G. 2
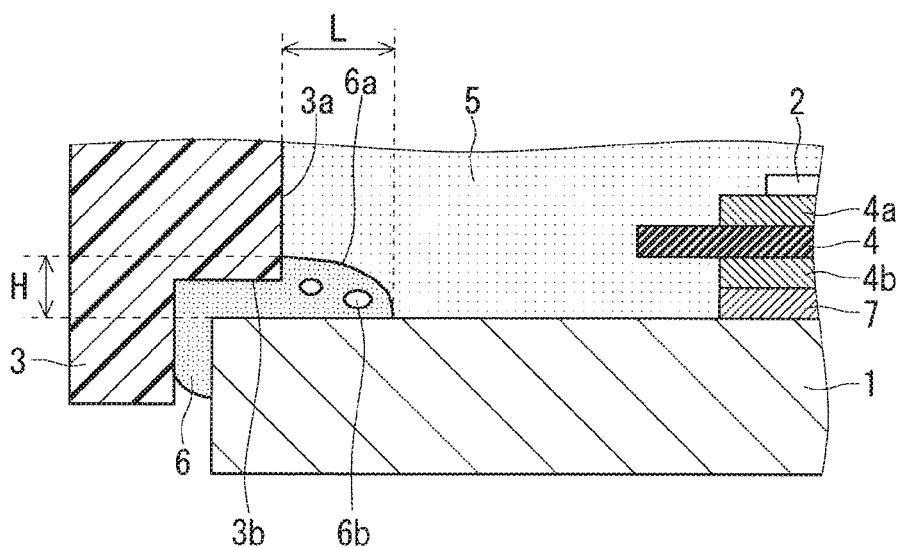

F I G . 3
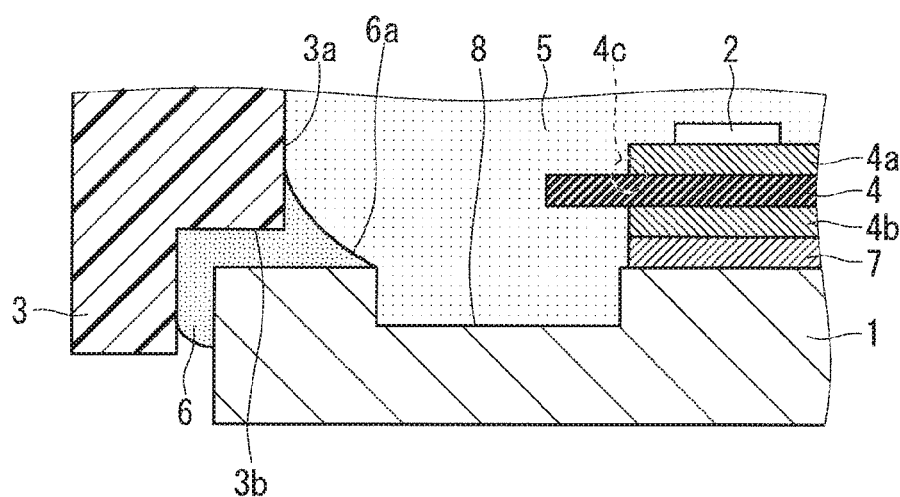
F I G . 4
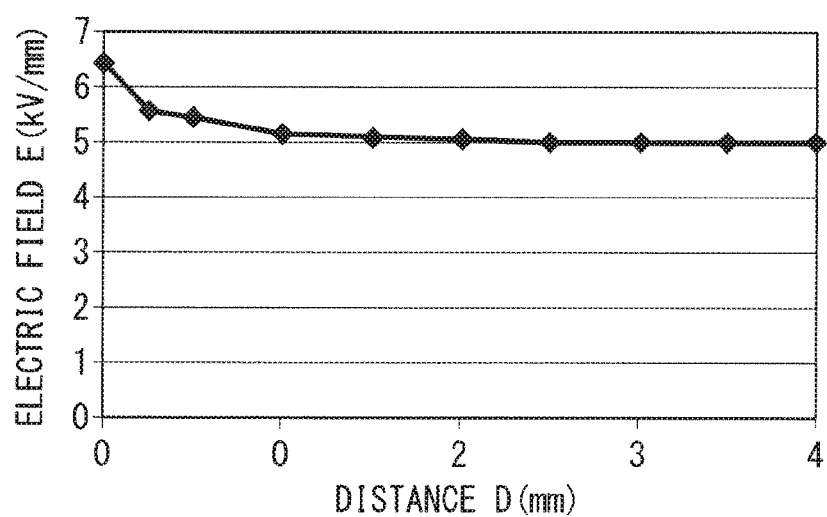

SEMICONDUCTOR MODULE

TECHNICAL FIELD

The present invention relates to semiconductor modules including semiconductor chips contained in cases.

BACKGROUND ART

Various techniques have been proposed concerning a conventional power semiconductor module including a case within which a sealing resin (gel) is filled. One example of such techniques is using an adhesive (sealant) order to prevent moisture from entering the inside of the ease via a joint and a fixing portion between the case and a base plate (heat-dissipation plate) (e.g., Patent Document 1). Another example is, without using the adhesive, forming a protrusion and a recess in the case and the base plate (heat-dissipation plate), and then fitting them to fix the case and the base plate (e.g., Patent Document 2).

PRIOR ART DOCUMENTS

Patent Documents

Patent Document 1: Japanese Patent Application Laid-Open No. 2000-323593
Patent Document 2: Japanese Patent Application Laid-Open No. 2014 203978

SUMMARY

Problem to be Solved by the Invention

In the configuration of Patent Document 1, the adhesive (sealant) is filled in a groove on the upper surface of the base plate, in the lower part of the side wall of the case. Unfortunately, air bubbles probably remain in the adhesive in the groove, and thus cause a reduction in insulation strength of a module. Further, in the configuration of Patent Document 2, the protrusion and the recess are provided to fix the case and the base plate without using the adhesive. This results in a complex structure. In addition, this configuration requires the protrusion and the recess to have more than certain depths. Thus, the sealing resin (gel) cannot extend into such a deep groove, thereby possibly producing gaps. This possibly results in a reduction in insulation strength (insulation performance).

The present invention has been made in view of the above-mentioned problems. It is an object of the present invention to provide a semiconductor module in which a case and a base plate joined together with a simple structure, the semiconductor module ha high insulation strength.

Means to Solve the Problem

The semiconductor module according to one aspect of the present invention includes the following: a base plate; at least one semiconductor chip disposed inside the base plate other than the outer periphery of the base plate and above the base plate; and a case joined to the outer periphery of the base plate with an adhesive, and containing the at least one semiconductor chip. The upper surface of the base plate is provided with a recess or a protrusion between an inner wall of the case and the at least one semiconductor chip in a plan view.

Effects of the Invention

In the aspect of the present invention, the upper surface of the base plate is provided with the recess or the protrusion between the inner wall of the case and the at least one semiconductor chip in a plan view. This enables the semiconductor module to include the case and base plate joined together with a simple structure and to have high insulation strength.

These and other objects, features, aspects and advantages of the present invention will become more apparent from the following detailed description of the present invention when taken in conjunction with the accompanying drawings.

BRIEF DESCRIPTION OF DRAWINGS

FIG. 1 is a cross-sectional view of a configuration of a semiconductor module according to a first embodiment.
FIG. 2 is a cross-sectional view of a configuration of a related semiconductor module.
FIG. 3 is a cross-sectional a configuration of a semiconductor module according to a second embodiment.
FIG. 4 is a graph showing an effect of the semiconductor module according to the second embodiment.

DESCRIPTION OF EMBODIMENT(S)

Figure 5:
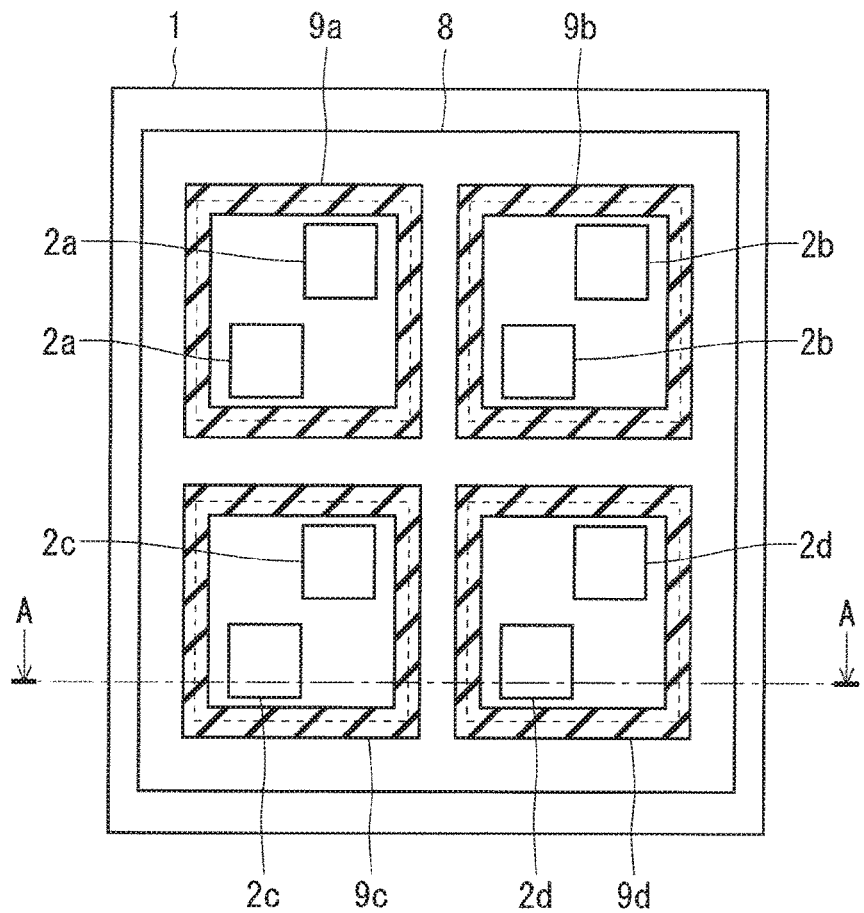
FIG. 5 is a plan view of part of a configuration of a semiconductor module according to a modification.

The following describes the embodiments with reference to the accompanying drawings. It is to be understood that the attached drawings are for the purpose of illustrating concepts of the embodiments discussed herein, and the sizes and positions of components illustrated in each drawing may not be to scale.

First Embodiment

FIG. 1 is a cross-sectional view of a configuration of a semiconductor module (power semiconductor module) according to a first embodiment of the present invention. The semiconductor module in FIG. 1 includes a base plate 1, a semiconductor chip 2, a case 3, an insulating substrate, which is a ceramic insulating substrate 4 in the first embodiment, and a sealant 5.

The base plate 1 is made of metal, such as Cu, AlSiC, and Al, where Cu represents copper; Al, aluminum; Si, silicon; and C, carbon. The base plate 1 is used as, for instance, a heat-dissipation plate.

The semiconductor chip 2 is disposed inside the base plate 1 other than the outer periphery of the base plate 1 and above the base plate 1. The semiconductor chip 2 may be made of Si for instance. Alternatively, the semiconductor chip 2 may be formed of a wide bandgap semiconductor made of a material, such as SiC and gallium nitride (GaN). Examples of the semiconductor chip 2 include an insulated gate bipolar transistor (IGBT), a metal oxide semiconductor field effect transistor (MOSFET), a diode, and a Schottky barrier diode (SBD). In the first embodiment, the semiconductor chip 2 is a SiC-MOSFET or a SiC-SBD.

The case 3 is joined to the outer periphery of the base plate 1 with an adhesive 6, and contains the semiconductor chip 2. The case 3 is made of a material, such as polyphenylene sulfide (PPS), and a combination of polyethylene terephthalate (PET) and polybutylene terephthalate (PBT). The adhesive 6 is made of, for instance, a silicone-based material or an epoxy-based material.

In the first embodiment, the lower part of the case 3 is provided with a cut 3b engageable with the upper part (corner) of the outer periphery of the base plate 1. Further, the adhesive 6 extends between the cut 3b of the case 3 and the upper part (corner) of the base plate 1.

The ceramic insulating substrate 4 is disposed between the semiconductor chip 2 and the base plate 1 in a cross-sectional view. Disposed on the front surface of the ceramic insulating substrate 4 is a front-surface metal pattern 4a. Disposed on the back surface of the ceramic insulating substrate 4 is a back-surface metal pattern 4b. The front-surface metal pattern 4a is connected to the lower part of the semiconductor chip 2. The back-surface metal pattern 4b is joined to the base plate 1 with a solder material 7.

The sealant 5 is made of an insulating material such as a silicone gel and is filled within the case 3. This enables the semiconductor module to be insulating.

Referring to the upper surface of the base plate 1, disposed is a recess between an inner wall 3a of the case 3 and the semiconductor chip 2 in a plan view. The recess, which in the first embodiment is a groove 8, is disposed on the upper surface of the base plate 1, the groove 8 extending along the inner wall 3a of the case 3 in a plan view. The groove 8 is conceivably filled with the sealant 5.

The following describes a method for manufacturing the semiconductor module according to the first embodiment. The components other than the base plate 1 are formed by the use of a typical method for manufacture; described herein is the formation of the base plate 1.

For the formation of the base plate 1 by melting metals, a protrusion corresponding to the groove 8 is disposed in a die (mold). This completes the base plate 1 provided with the groove 8 by molding. It is noted that the base plate 1 may undergo etching for a stable groove 8.

Alternatively, for the formation of the groove 8 onto the front surface of the base plate 1 after molding the base plate 1 with no groove 8, the front surface of the base plate 1 without the groove 8 undergoes masking with a resist to selectively etch the base plate 1. This completes the base plate 1 provided with the groove 8. It is noted that the base plate 1 may undergo pressing to form the groove 8 onto the base plate 1 if the etching process is not performed.

The semiconductor module according to the first embodiment has such a configuration, in which the adhesive 6 is used. This enables the case 3 and the base plate 1 to be joined together with a simple structure. In addition, the upper surface of the base plate 1 is not provided with a groove in the lower part of the side wall of the case 3. This reduces air bubbles within the adhesive 6 after being solidified. Consequently, the semiconductor module has high insulation strength.

Reference is now made to a detailed effect of the semiconductor module according to the first embodiment. The following describes a semiconductor module relating to the semiconductor module according to the first embodiment (hereinafter, referred to as a "related semiconductor module") with reference to FIG. 2. It is to be noted that identical reference numerals are used to denote identical or similar components between the semiconductor module according to the first embodiment and the related semiconductor module, and mainly described herein are components different between these semiconductor modules.

Different semiconductor modules such as the related semiconductor module in which the base 1 and the case 3 are joined together with the adhesive 6 have different shapes of the adhesive 6 due to a warp (bend) of the base plate 1 or the case 3. Such variations in shape of the adhesive 6 cause the following two problems.

The first one arises because a height H (FIG. 2) of a fillet 6a of the adhesive 6, inside the case 3 can be insufficient. An insufficient height H of the fillet 6a produces a gap in an interface between the fillet 6a and the inside of the case 3, thereby causing the sealant 5 within the case 3 to leak from the gap to the outside of the case 3 or causing water from the outside of the case 3 to enter the inside of the case 3. The fillet 6a of the adhesive 6 before being solidified needs to sufficiently extend upwardly along the inner wall 3a of the case 3 in order that the adhesive 6 has a leakage-and-entrance prevention function without being affected by the warp (bend) of the base plate 1 or the case 3. In other words, the height H of the fillet 6a needs to be sufficiently large in order that no gap is produced due to the variations.

The second one arises because a sagging length L (FIG. 2) of the fillet 6a of the adhesive 6, inside the case 3 can be large. A large sagging length L of the fillet 6a probably causes the adhesive 6 to contain air bubbles 6b. The air bubbles 6b contained in the adhesive 6 likely bursts out of the adhesive 6 under high temperature to move to the inside of the sealant 5. Then, when the air bubbles move to the neighborhood of the ceramic insulating substrate 4, insulation performance reduces, thereby resulting in an insulation failure. In addition, when the fillet 6 has a greatly large sagging length L and the adhesive 6 flows to reach under the ceramic insulating substrate 4, a stress that has occurred in the ceramic insulating substrate 4 changes. This causes a crack in the ceramic insulating substrate 4, thereby resulting in the insulation failure.

In order to prevent the reduction in the insulation performance due to the sagging length L of the fillet 6a, a current module is provided with a relatively large clearance between the case 3 and the ceramic insulating substrate 4. Unfortunately, this causes the related semiconductor module to have a relatively large size. Further, in order to solve the first problem, an effort to make the height H of the fillet 6a large by increasing the amount of the adhesive 6 increases the sagging length L of the fillet 6a, thereby rendering the second problem obvious.

Reference is made to the adhesive 6 before being solidified that is pushed out when the case 3 and the base plate 1 is joined together. In the semiconductor module according to the first embodiment, contrary to the related semiconductor module, a surface tension attributed to the groove 8 in FIG. 1 prevents the adhesive 6 from sagging. This reduces the sagging length L of the fillet 6a and instead makes the fillet 6a protuberant, thereby making the height H of the fillet 6a large. As a result, the first problem (the leakage of the sealant 5 and the entrance of water) is solved, and the second problem (the reduction in the insulation performance) is solved. In addition, the clearance between the case 3 and the ceramic insulating substrate 4 is hopefully reduced. Hence, the semiconductor module is hopefully miniaturized.

Further, the adhesive 6 extends between the cut 3b of the case 3 and the upper part (corner) of the base plate 1 in the first embodiment. This reduces occurrences of the gap between the case 3 and the base plate 1, thereby preventing the leakage of the sealant 5 and the entrance of water.

In the first embodiment, the semiconductor chip 2 is formed of a wide bandgap semiconductor made of a material such as SiC. This enables the semiconductor chip 2 to operate under high temperature and at high speed, thereby hoping miniaturization of a cooler near the module or miniaturization of a controlling circuit near the module. Consequently, an inverter system, for instance, is also hopefully miniaturized.

Second Embodiment

FIG. 3 is a cross-sectional view of a configuration of a semiconductor module according to a second embodiment of the present invention. It is to be noted that identical reference numerals are used to denote identical or similar components between the semiconductor module according to the first embodiment and the semiconductor module according to the second embodiment, and that mainly described herein are components different between these semiconductor modules.

In the second embodiment, as illustrated in FIG. 3, one widthwise end of the groove 8 is located in the vicinity of the inner wall 3a of the case 3 in a plan view. The other widthwise end of the groove 8 is located, in a plan view, outside the solder material 7 and in the vicinity of the solder material 7. The solder material 7 is a joint between the ceramic insulating substrate 4 and the base plate 1.

FIG. 4 is a graph showing relationships between a distance D and an electric field E applied to an end 4c (FIG. 3) of the front-surface metal pattern 4a of the ceramic insulating substrate 4, where the distance D denotes a distance between the ceramic insulating substrate 4 and the bottom of the groove 8 (FIG. 3). The depth of the groove 8 corresponds to a length obtained by subtracting the thicknesses of the back-surface metal pattern 4b and the solder material 7 from the distance D.

As shown in FIG. 4, a longer distance D equates with a less electric field E at the end 4c of the front-surface metal pattern 4a. It is noted that the distance D is preferably 1 mm or more, and is more preferably 2 mm or more.

The semiconductor module according to the second embodiment enables the electric field of the ceramic insulating substrate 4 (front-surface metal pattern 4a) to be lessened. Accordingly, the semiconductor module has high insulation performance.

Modification

Figure 6:
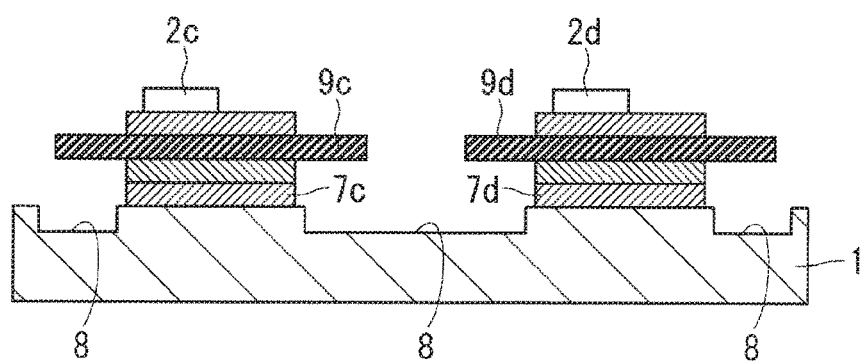
FIG. 6 is a cross-sectional view of the part of the configuration of the semiconductor module according to a modification.

In some embodiments, a groove similar to the groove 8 is disposed in any part of the base plate 1 other than the aforementioned part of the base plate 1. FIG. 5 is a plan view of part of a configuration of a semiconductor module according to a modification. FIG. 6 is a cross-sectional view taken along line A-A in FIG. 5.

The semiconductor device according to the modification includes, instead of the semiconductor chip 2, a semiconductor chip 2a, a semiconductor chip 2b, a semiconductor chip 2c, and a semiconductor chip 2d. The semiconductor chip 2a is adjacent to the semiconductor chips 2b and 2c; and the semiconductor chip 2b, to the semiconductor chips 2a and 2d. The semiconductor chip 2c is adjacent to the semiconductor chips 2a and 2d; and the semiconductor chip 2d, to the semiconductor chips 2b and 2c.

Here, any two adjacent semiconductor chips from among the semiconductor chips 2a, 2b, 2c, and 2d are allocated as a first semiconductor chip and a second semiconductor chips. Hereinafter, the first semiconductor chip is the semiconductor chip 2c; and the second semiconductor chip, the semiconductor chip 2d. In any other combination of the semiconductor chips, the semiconductor module is configured in a manner similar to that described below.

The semiconductor device according to the modification includes divided ceramic insulating substrates 9a, 9b, 9c, and 9d instead of the ceramic insulating substrate 4. Each of the ceramic insulating substrates 9a, 9b, 9c, and 9d is configured in a manner similar to the ceramic insulating substrate 4. That is, a first insulating substrate, which in this modification is the ceramic insulating substrate 9c, is disposed between the semiconductor chip 2c (i.e., the first semiconductor chip) and the base plate 1. Moreover, a second insulating substrate, which in this modification is the ceramic insulating substrate 9d, is disposed between the semiconductor chip 2d (i.e., the second semiconductor chip) and the base plate 1. Likewise, the ceramic insulating substrate 9a is disposed between the semiconductor chip 2a and the base plate 1; and the ceramic insulating substrate 9b, between the semiconductor chip 2b and the base plate 1.

In the modification, the groove 8 is disposed also between a solder material 7c and a solder material 7d, the groove 8 being disposed on the upper surface of the base plate 1, as illustrated in FIGS. 5 and 6. Here, the solder material 7c is a joint between the ceramic insulating substrate 9c (first insulating substrate) and the base plate 1. Moreover, the solder material 7d is a joint between the ceramic insulating substrate 9d (second insulating substrate) and the base plate 1.

The semiconductor module according to the modification has high insulation performance, which is similar to the semiconductor module according to the second embodiment.

Third Embodiment

Figure 7:
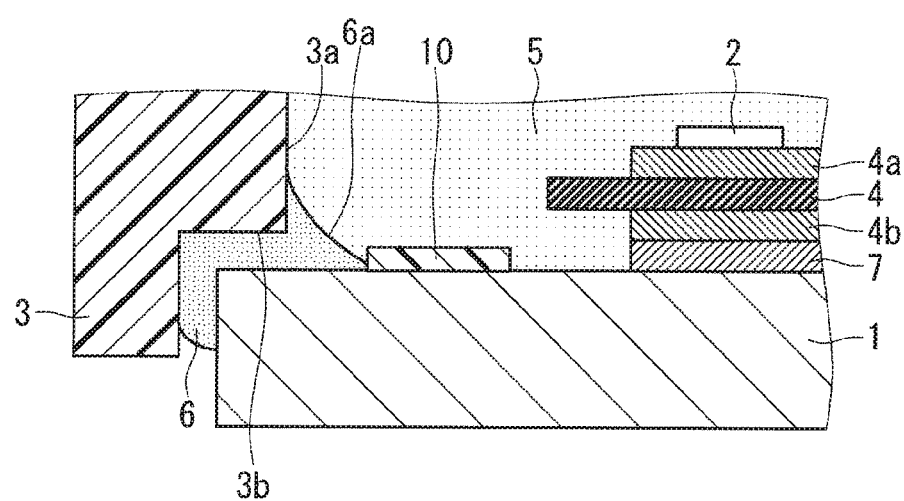
FIG. 7 is a cross-sectional view of a configuration of a semiconductor module according to a third embodiment.

FIG. 7 is a cross-sectional view of a configuration of a semiconductor module according to a third embodiment. It is to be noted that identical reference numerals are used to denote identical or similar components between the semiconductor module according to the first embodiment and the semiconductor module according to the third embodiment, and that mainly described herein are components different between these semiconductor modules.

The upper surface of the base plate 1 is provided with a protrusion between the inner wall 3a of the case 3 and the semiconductor chip 2 in a plan view. The protrusion, which in the third embodiment is a resist 10, is disposed on the upper surface of the base plate 1. In some embodiments, the resist 10 extends along the inner wall 3a of the case 3 in a plan view, which is similar to the groove 8 in the first embodiment. It is preferable that the height of the resist 10 be sufficiently larger than that of the distal end of the fillet 6a.

The semiconductor module according to the third embodiment, in which the adhesive 6 is used, enables the case 3 and the base plate 1 to be joined together with a simple structure. In addition, the semiconductor module is configured such that the upper surface of the base plate 1 is not provided with a groove in the lower part of the side wall of the case 3. This reduces air bubbles within the adhesive 6 after being solidified. As a result, the semiconductor module has high insulation performance. Moreover, the resist 10 prevents the adhesive 6 from sagging, which is similar to the first embodiment, thereby preventing the leakage of the sealant 5 and the entrance of water and preventing the reduction in insulation performance.

It is noted that in the present invention, the individual embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS 1 base plate, 2, 2a, 2b, 2c, 2d semiconductor chip, 3 case, 3a inner wall, 3b cut, 4, 9a, 9b, 9c, 9d ceramic insulating substrate, 6 adhesive, 8 groove, and 10 resist.

The invention claimed is:

1. A semiconductor module comprising:
   a base plate;
   at least one semiconductor chip disposed above a region of the base plate inside of an outer peripheral region of the base plate; and
   a case joined to the outer peripheral region of the base plate with an adhesive, and containing the at least one semiconductor chip, wherein
   a protrusion is disposed on an upper surface of the base plate or the upper surface of the base plate comprises a recess, the recess or the protrusion being adjacent to an inner wall of the case and between the inner wall of the case and the at least one semiconductor chip in a plan view,
   the adhesive comprises a fillet-shaped portion between the inner wall of the case and the recess or the protrusion, and
   the fillet-shaped portion extends in a direction towards the at least one semiconductor device along the upper surface of the base plate from the inner wall of the case to an outermost side of the recess or protrusion adjacent to the inner wall of the case.

2. The semiconductor module according to claim 1, wherein the recess comprises a groove disposed on the upper surface of the base plate, the groove extending along the inner wall of the case in a plan view.

3. The semiconductor module according to claim 2, further comprising
   an insulating substrate disposed between the at least one semiconductor chip and the base plate, wherein
   one widthwise end of the groove is located in a vicinity of the inner wall of the case in a plan view, and another widthwise end of the groove is located, in a plan view, outside a joint between the insulating substrate and the base plate and in a vicinity of the joint.

4. The semiconductor module according to claim 2, further comprising:
   a first insulating substrate disposed between a first semiconductor chip of the at least one semiconductor chip and the base plate; and
   a second insulating substrate disposed between a second semiconductor chip of the at least one semiconductor chip and the base plate,
   the first and second semiconductor chips being adjacent to each other, wherein
   the groove is disposed also between a joint between the first insulating substrate and the base plate, and a joint between the second insulating substrate and the base plate, the groove being disposed on the upper surface of the base plate.

5. The semiconductor module according to claim 1, wherein
   a lower part of the case comprises a cut engageable with an upper part of the outer peripheral region of the base plate, and
   the adhesive is disposed between the cut of the case and the upper part of the base plate.

6. The semiconductor module according to claim 1, wherein the at least one semiconductor chip comprises a wide bandgap semiconductor.

7. A semiconductor module comprising:
   a base plate;
   at least one semiconductor chip disposed above a region of the base plate inside of an outer peripheral region of the base plate; and
   a case joined to the outer peripheral region of the base plate with an adhesive, and containing the at least one semiconductor chip, wherein
   a protrusion is disposed on an upper surface of the base plate or the upper surface of the base plate comprises a recess, the recess or the protrusion being between an inner wall of the case and the at least one semiconductor chip in a plan view, and
   the adhesive comprises a fillet shape portion between the inner wall of the case and the recess or the protrusion, wherein
   the protrusion comprises a resist.

* * * * *